US005958799A

United States Patent [19]
Russell et al.

[11] Patent Number: 5,958,799
[45] Date of Patent: Sep. 28, 1999

[54] METHOD FOR WATER VAPOR ENHANCED CHARGED-PARTICLE-BEAM MACHINING

[75] Inventors: Phillip E. Russell, Apex; Dieter P. Griffis, Morrisville, both of N.C.; Gordon M. Shedd, Fishers, N.Y.; Terrance J. Stark, Durham, N.C.; James Vitarelli, Dublin, Calif.

[73] Assignee: North Carolina State University, Raleigh, N.C.

[21] Appl. No.: 08/421,811

[22] Filed: Apr. 13, 1995

[51] Int. Cl.[6] .................................................. H01L 21/02
[52] U.S. Cl. .............................. 438/712; 216/49; 216/66; 216/72; 216/77; 216/79; 438/738
[58] Field of Search .............................. 156/643.1, 646.1; 216/65–67, 58, 72, 81, 77, 79, 49; 438/712, 738

[56] References Cited

U.S. PATENT DOCUMENTS

| | | | |
|---|---|---|---|
| 3,548,189 | 12/1970 | Meinel et al. | 216/81 |
| 4,486,292 | 12/1984 | Blackburn | 204/416 |
| 4,876,112 | 10/1989 | Kaito et al. | 427/38 |
| 4,980,022 | 12/1990 | Fujimura et al. | 156/643.1 |
| 5,057,187 | 10/1991 | Shinagawa et al. | 156/643.1 |
| 5,160,405 | 11/1992 | Miyauchi et al. | 216/81 |
| 5,188,705 | 2/1993 | Swanson et al. | 156/643 |
| 5,350,499 | 9/1994 | Shibaike et al. | 216/66 |
| 5,397,432 | 3/1995 | Konno et al. | 156/643.1 |
| 5,464,480 | 11/1995 | Matthews | 156/643.1 |
| 5,798,529 | 8/1998 | Wagner | 250/492.2 |

FOREIGN PATENT DOCUMENTS

| | | |
|---|---|---|
| 0 463 870 | 1/1992 | European Pat. Off. . |
| WO89/04052 | 5/1989 | WIPO . |

OTHER PUBLICATIONS

J.J. Hren; "Barriers to AEM: Contamination and Etching"; *Introduction to Analytical Electron Microscopy*, 18:481–505 (1979), month unavailable.

Stark et al.; "H2O enhanced focused ion beam micromachining"; *J. Vac. Sci. Technol.*, B 13(6):2565–2569 (1995), month unavailable.

T. Kosugi et al; In situ patterning of GaAs by focused ion beam; *Journal of Vacuum Science & Technology*; 9 No. 6, Part B; pp. 3099–3102 (1991), month unavailable.

H. Kuwano; Dry development of resists exposed to low–energy focused gallium ion beam; *Journal of Applied Physics*; 55, No. 4; pp. 1149–1154 (1984), month unavailable.

B. Kempf et al; $N_2/H_2O$: A New Gas Mixture for Deep Groove Ion Beam Etching of Long Wavelength Quaternary Mushroom Type Laser Structures; International Conference on Solid State Devices and Materials pp. 477–480; (1990), month unavailable Tokyo, Japan.

Patent Abstract of Japan vol. 6., No. 118 (C–111), Jul. 2, 1982 & JP,A,57 047800 (Citizen Watch, Mar. 18, 1982).

(List continued on next page.)

*Primary Examiner*—T. Tung
*Attorney, Agent, or Firm*—Myers Bigel Sibley & Sajovec

[57] ABSTRACT

Water vapor enhanced focused particle beam machining speeds up the removal of polymer-based dielectric materials from areas surrounding metallic interconnects on integrated circuits while at the same time decreasing the rate of removal of aluminum. Selective material removal protects metal interconnects from machining damage and greatly reduces the time that protective material is exposed to the particle beam.

13 Claims, 2 Drawing Sheets

OTHER PUBLICATIONS

N. Uchida et al; Thermochemical etching effect of $H_2O$ vapor on CVD diamond film; *Journal of Crystal Growth* 114 No. 4; pp. 565–568 (1991), month unavailable.

J.F. McDonald et al; *Application of Focused ion beam for testing, repair and fabrication of metal and optical interconnections in wafer scale integration;* Proc. Int. Conf. on Wafer Scale Integration, San Francisco pp. 161–172 (1989), month unavailable.

S. Matsui et al; Electron beam induced selective etching and deposition technology; *Journal of Vacuum Science & Technology*; Part B 7, No. 5; pp. 1182–1190 (1989), month unavailable.

G.S. Chen et al; *Electron beam damage in $AlF_3$; Inst.Phys. Conf. Ser.* 119; Section 8 pp. 325–328 (1991), month unavailable.

Melngailis, J., Critical Review: Focused ion beam technology and applications; J. Vac. Sci. Technol.B 5(2); Mar./Apr. 1987; pp. 469–495.

Orloff, J., Focused Ion Beams; Scientific American; Oct. 1991; pp. 96–101.

Ximen, H. et al., *Halogen–Based Selective FIB Milling for IC Probe–Point Creation and Repair;* Proceedings of the 20th Intenational Symposium for Testing and Failure Analysis, Nov. 13–18, 1994; pp. 141–150.

METHOD FOR WATER VAPOR ENHANCED CHARGED-PARTICLE-BEAM MACHINING

FIELD OF THE INVENTION

The present invention relates to particle beam machining, and, more particularly, to a method for chemically enhancing particle beam machining.

BACKGROUND OF THE INVENTION

Focused ion beams are used in forming, shaping, or altering microscopic structures, such as semiconductor devices. See for example, "Scientific American", January 1991, pages 96–101 by Jon Orloff. A focused ion beam can be directed to a very small point on a semiconductor device and then scanned, raster fashion, over a surface where material is to be removed. When an ion impinges the surface, its momentum is transferred, resulting in the removal of one or more surface atoms according to a process called sputtering. By selecting a raster pattern of a particular shape, a correspondingly shaped area of surface material can be removed. Often several successive layers of a semiconductor device are removed in a given area in order to expose and possibly sever an underlying layer.

The material removal rate, or yield (volume of material removed per incident ion or other changed particle), however, is limited by the ion current that can be concentrated into a submicron beam, which is typically no more than several nanoamperes. Therefore, the total volume of material that can be removed in a reasonable period of time by sputtering is limited. In an effort to increase material removal rates and thus decrease processing times, sputtering-enhancing gases, typically halogen-based compounds, are commonly used to chemically enhance the sputter yield. The sputter-enhancing gases are relatively stable, except in the area of the workpiece being sputtered, where they react with the workpiece and change the material removal rate from that achieved by physical sputtering alone. In addition to increasing yield, chemically-enhanced sputtering also reduces the re-deposition of previously removed material. Furthermore, chemically-enhanced sputtering causes the yield of some materials to increase while not affecting the yield or actually decreasing the yield, of other materials, creating a ratio of yields between those materials.

The ratio of yields between different materials is referred to as "selectivity", and can be either advantageous or disadvantageous, depending on the situation. For example, where it is desirable to remove a thick layer of passivation material L1 to expose, without significant destruction, a thin underlying layer of material L2, the process would be simplified dramatically by using a gas which increases the yield of L1 or decreases the yield of L2. Such a gas would reduce the processing time required and decrease the criticality of end point detection by increasing the time, relative to the total process time, that L2 can be sputtered without significant removal. However, simply reversing the workpiece materials, for example, placing a thick layer of L2 on top of L1, and sputtering with the same gas would increase the processing time and cause endpoint detection to become critical in order to avoid over-sputtering of L1. The increased uncertainty in endpoint could outweigh any time savings achieved from an increase in yield of L2, causing the chemical enhancement to actually be more of a hinderance than a help.

In the ideal focused particle beam system, a variety of gases having different yield ratios would be available to choose from depending on the material constituency of the workpiece being machined. Unfortunately, only a few gases commonly used, most of which are halogen-based, are available, limiting the material combinations that can benefit from chemically enhanced particle beam machining. Furthermore, the yield for carbonaceous materials, such as polyimide, resists and diamond, is not significantly enhanced using the existing halogen-based gases. Another disadvantage is that halogen-based compounds are hazardous and pose handling and usage problems that complicate and increase the cost of chemically enhanced machining.

SUMMARY OF THE INVENTION

It is therefore an object of the present invention to provide an improved method of chemically enhanced particle beam machining wherein material removal rates are selectively increased and decreased.

It is another object of the present invention to expand the material combinations that can benefit from chemically enhanced particle beam machining.

It is yet another object of the present invention to provide a method of chemically enhanced particle beam machining that utilizes an environmentally innocuous chemical.

These and other objects are provided according to one aspect of the present invention by a method for carrying out focused particle beam machining of material from a substrate, comprising the steps of maintaining the substrate within a vacuum; applying water vapor to the substrate; and bombarding the substrate and applied water vapor with a focused particle beam. The particle beam may comprise various types of charged particles including, but not limited to, electrons and ions, such as gallium ions. The application of the water vapor to the material to be removed may be accomplished by gas jet injecting.

The material of the substrate surface to be machined may comprise various materials, including, but not limited to, diamond, polymer, silicon, and aluminum. Because the addition of water vapor during particle beam machining allows the rate of removal to be increased or decreased, depending on the material, certain substrate surface materials may be selected so that the water vapor enhances the rate of removal during machining. Additionally, certain substrate surface materials may be selected so that the water vapor decreases the rate of removal during machining. Furthermore, the material may be removed from the substrate surface in a defined pattern.

According to another aspect of the present invention, a method for carrying out focused particle beam machining of material from a substrate including first and second materials, comprises the steps of maintaining the substrate within a vacuum; applying water vapor to the substrate; and bombarding both the first and second materials and applied water vapor with a focused particle beam. The first and second materials may be selected so that the water vapor selectively increases the rate of removal of the first material and decreases the rate of removal of the second material.

Because of the selective machining capability provided by the addition of water vapor, layers of a first material overlying a second material may be substantially completely removed from the substrate, while the second material is substantially not removed from the substrate. For example, layers of polyimide may be removed to expose underlying aluminum interconnects, without removing or damaging the aluminum interconnects.

DETAILED DESCRIPTION OF THE EMBODIMENTS

Figure 1:
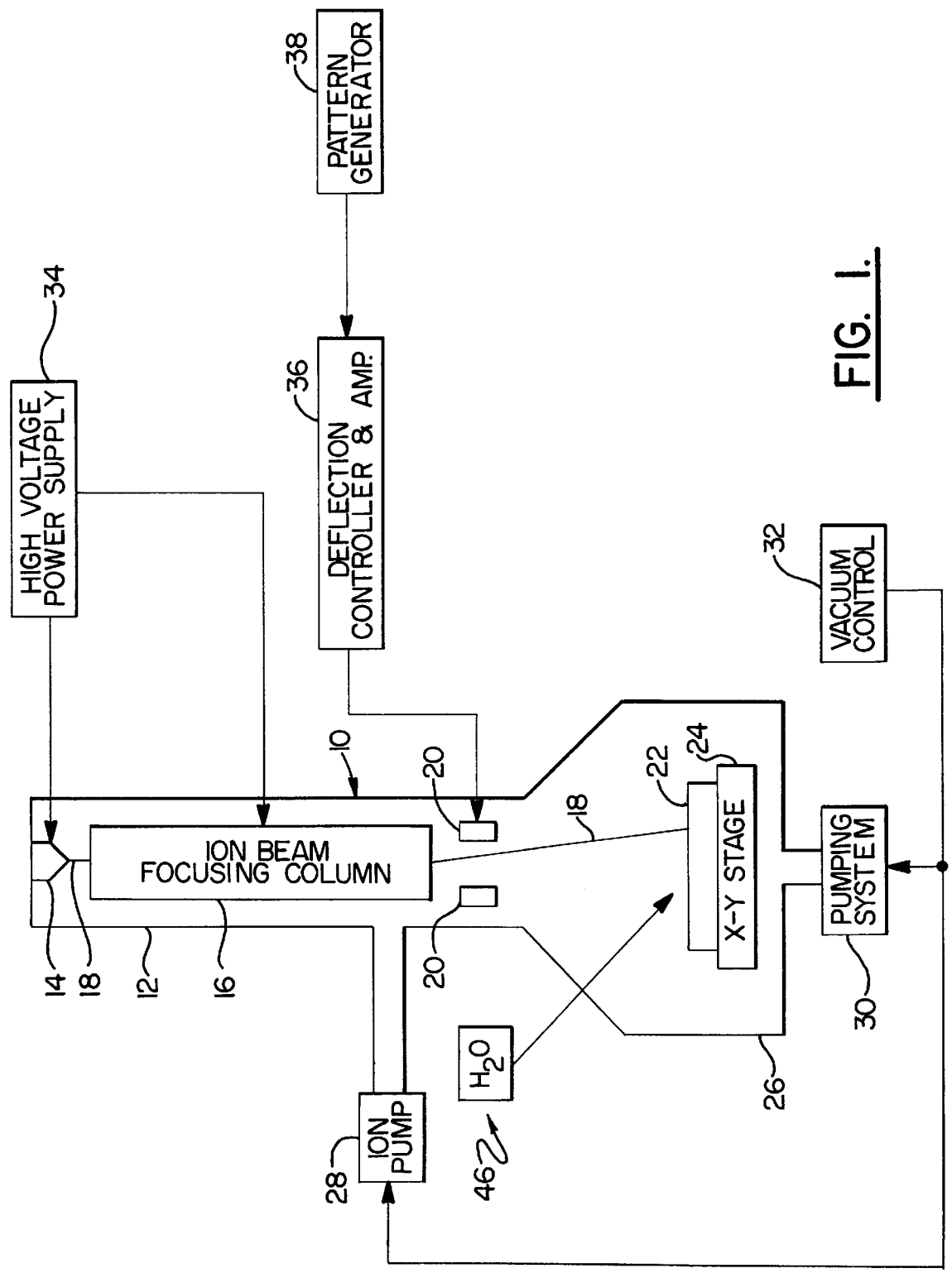
FIG. 1 is a schematic representation of a focused ion beam system adapted for carrying out the process of the present invention.

The present invention is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout.

Focused ion beam machining is known and disclosed, for example, in U.S. Pat. No. 5,188,705 to Swanson, et al., the disclosure of which is incorporated herein by reference. Referring to FIG. 1, a focused particle beam system for selectively increasing the rate of removal of certain materials and decreasing the rate of removal of other materials according to the present invention is illustrated. An evacuated envelope 10 includes an upper neck portion 12 within which a liquid metal ion source 14 and a focusing column 16 are located. The particle beam 18 passes from the source 14 through the column 16 and between electrostatic deflectors 20 toward workpiece 22, which is positioned on a movable X-Y stage 24 within the lower chamber 26. The workpiece 22 can be any device or substance capable of being machined by a charged particle beam, including, but not limited to, microelectronics including semiconductors, optics and any device having multi-layer coatings. An ion pump 28 is employed for evacuating the neck portion 12. The lower chamber 26 is evacuated with a pumping system 30 operated by a vacuum controller 32.

A high voltage power supply 34 is connected to the liquid metal ion source 14 as well as to electrodes (not shown) contained within the focusing column 16 for forming an approximately 25 keV particle beam 18 and directing the beam downwardly in the direction of the workpiece 22. The deflection controller and amplifier 36, which is operated in accordance with a prescribed pattern such as a raster pattern provided by the pattern generator 38, is coupled to the electrostatic deflection means 20, whereby the particle beam 18 can be controlled to sputter a pattern on the upper surface of the workpiece 22. In one embodiment, the liquid metal ion source 14 provides a beam of gallium ions, although other ions or particles could be used. In another embodiment, the particle beam 18 could comprise electrons.

Figure 2:
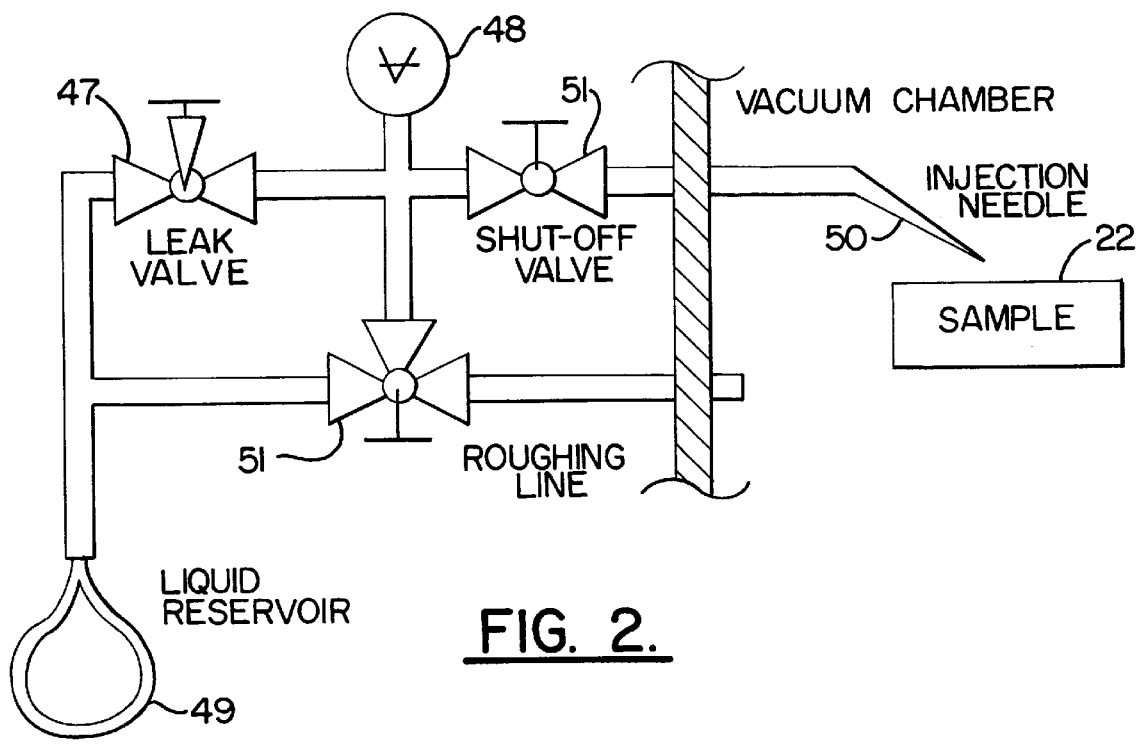
FIG. 2 is a schematic illustration of the gas injection system for providing water vapor.

In accordance with the present invention, the focused particle beam system is further provided with a source 46 for supplying water vapor. In a preferred embodiment, the water vapor is provided via a gas injection system, schematically illustrated in FIG. 2, and comprises a liquid reservoir 49, injection needle 50, leak valve 47, and shut-off valves 51. The water vapor is fed to the surface of the workpiece 22 through an injection needle 50 that is preferably positionable to within approximately 100 $\mu$m of the workpiece. The gas flow from the water vapor source 46 may be controlled, for example, using a variable leak valve 47, such as a Granville Phillips Series 203 valve, as would be known to those skilled in the art. Also, as would be known to those skilled in the art, the gas pressure at the entrance to the injector needle 50 may be monitored using a suitable vacuum gauge 48. For example, for a 0.5 mm outside diameter needle, a desirable flow rate through the needle would be approximately $2 \times 10^{-6}$ torr-liter/sec, yielding a pressure at the workpiece surface of approximately 1 mTorr, although, as would be understood by those having skill in the art, other flow rates and pressures at the surface of the workpiece 22 would be acceptable.

Figure 3:
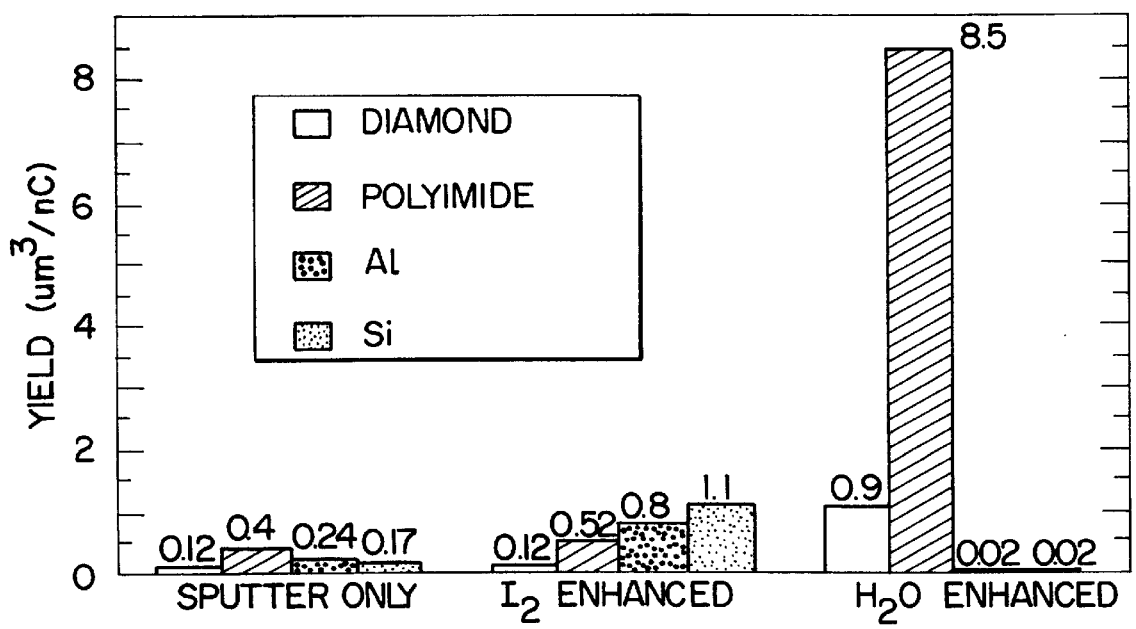
FIG. 3 is a graph showing sputtering yields of diamond, polyimide, aluminum and silicon when being removed with physical sputtering, with $I_2$ enhanced sputtering, and with $H_2O$ enhanced sputtering.

The removal rates of various materials according to one embodiment of the present invention are illustrated in FIG. 3. The yields summarized are for diamond, polyimide, silicon (Si) and aluminum (Al) without any chemical enhancement, with $I_2$ enhancement, and with $H_2O$ enhancement. Water vapor was introduced to the workpiece surface while a 125 $\mu m^2$ area was scanned with a 1 nanoampere, 25 keV gallium ion beam. The gallium beam, having an approximate diameter of 0.16 of $\mu$m, was scanned in a meander pattern, stepping in 0.16 $\mu$m increments (0% overlap) and dwelling for 0.4 $\mu$s at each step to yield a frame time (time between consecutive exposures of the same pixel) of 2 ms. The yield ($\mu m^3$/nanocoulomb) was measured as the depth milled into the workpiece (determined by cross sectional analysis) divided by the dose of gallium. Yields, both with and without $H_2O$ enhancement, were measured on polyimide passivation, polymethylmethacrylate (PMMA) resist, Al interconnects, Si and diamond to determine the ratio of yields with and without $H_2O$. The ratio of yields using $I_2$ was also measured for comparison.

Two results from $H_2O$ enhanced sputtering are illustrated in FIG. 3. First, the yields of diamond and polyimide increased by a factor of 7 and 20, respectively, when $H_2O$ is present. The yield achieved for polyimide (>8 $\mu m^3$/nanocoulomb) corresponds to a removal of more than 100 workpiece atoms for each incident ion. Secondly, the amount of Si and Al sputtered from the workpiece decreased by nearly an order of magnitude. This combination of increasing the yield of polyimide while decreasing the yield of Si or Al results in a net selectivity to polyimide over Si or Al of more than 400:1, allowing highly material selective machining to be achieved. Accordingly, the present invention allows greater selectivity and control over the rate of removal of more materials than was previously possible.

Further tests were conducted with an integrated circuit having a 5 $\mu$m thick layer of polyimide passivation over four Al interconnects. The polyimide was removed from several 5×25 $\mu$m areas of the integrated circuit using physical sputtering, $I_2$ enhanced sputtering, and $H_2O$ enhanced sputtering. Removal of the polyimide using physical sputtering took more than 23 minutes to open a single area exposing an underlying Al interconnect. When $I_2$ enhanced sputtering was used to remove the polyimide, the processing time was reduced to 17 minutes. However, as soon as the Al lines were exposed, they were sputtered more rapidly than the polyimide, making detection of initial clearing of the Al (i.e., the end point), critical to prevent destruction of the Al. Furthermore, uneven sputtering over the Al lines made it impossible to completely clear the polyimide from above the Al without over-sputtering the Al in other areas.

Removal of the polyimide using $H_2O$ enhanced sputtering took less than 2 minutes and completely removed the polyimide from both the tops and sides of the Al lines. Even with over-sputtering to remove the polyimide from the sides of the approximately 1 $\mu$m thick Al lines, only negligible amounts of Al were removed. As would be known to those with skill in the art, the formation of oxides on the surface of certain metals is enhanced by the presence of water.

Contributing to the decrease in rate of removal during water vapor enhanced particle beam machining, according to the present invention, is the formation of oxides on the surface of those metals that are capable of forming them.

Water vapor enhanced particle beam machining not only reduces processing time, but also provides better process control. The high selectivity of $H_2O$ enhanced particle beam machining of polyimide over Al also allows the removal of polyimide passivation and dielectric layers from an integrated circuit to expose multiple metal levels without compromising the integrity of the upper level circuitry. This process would be difficult without $H_2O$ enhancement. For example, sputtering a 30×30 $\mu$m hole, using a 1 nanoampere beam through 6 $\mu$m of polyimide to expose the substrate below takes only 11 minutes. Creating the same hole using physical sputtering alone, takes about 225 minutes, and the upper level Al lines would be completely removed by the time the polyimide dielectric layer had been sputtered from the lower level metal.

Additionally, $H_2O$ enhanced particle beam machining allows PMMA and various other optical resists on Si substrates to be rapidly modified without significant damage to the substrate. This is particularly useful for cross sectional analysis of resist lines and for modification of X-ray masks as it has allowed the resist pattern to be altered, prior to deposition of the absorber metal, without damaging the supporting membrane material. The significant increase in the yield for single crystal diamond, from approximately 0.12 to 0.9 $\mu m^3$/nanocoulomb, when using $H_2O$ enhanced sputtering greatly increases the capability to micromachine diamond.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of chemically-enhanced ion beam machining for cross-sectional analysis of a carbonaceous material on an integrate circuit substrate, comprising:

maintaining an integrated circuit substrate in a vacuum;

bombarding with a focused ion beam a portion of the substrate including thereon a carbonaceous photoresist material to expose for analysis a cross section of the carbonaceous photoresist material; and exposing the portion of the substrate to water vapor at a concentration sufficient to enhance sputtering of the carbonaceous photoresist material and to attenuate the sputter rate of the underlying material to thereby rapidly expose by sputtering a cross section of the carbonaceous photoresist material without the ion beam significantly damaging material lying under the carbonaceous photoresist material after the carbonacecus photoresist material is sputtered away; and carrying out a cross-sectional analysis of the exposed carbonaceous photoresist material.

2. The method of claim 1 in which the photoresist includes PMMA.

3. The method of claim 1 in which the photoresist layer includes polyimide.

4. The method of claim 1 in which the substrate comprises a semiconductor material.

5. The method of claim 1 in which the underlying material comprises a metal.

6. The method of claim 5 in which the underlying material includes aluminum.

7. A method of chemically-enhanced ion beam machining for cross-sectional analysis of a photoresist material on an integrated circuit substrate, the method comprising:

maintaining the integrated circuit substrate having the photoresist material thereon in a vacuum;

bombarding a portion of the photoresist material with a sub-micron focused ion beam to expose for analysis a cross-section of the photoresist material;

exposing the photoresist material to a supply of water vapor during ion bombardment, the water vapor concentration at the substrate being sufficient to enhance sputtering of the photoresist material; and carrying out a cross-sectional analysis of the photoresist material.

8. The method of claim 7 in which exposing the photoresist material to a supply of water vapor during ion bombardment includes exposing the photoresist material to a supply of water vapor in the absence of sufficient halogen to enhance etching of the first or second material.

9. The method of claim 7 in which exposing the photoresist material to a supply of water vapor includes exposing the photoresist material to water vapor at a partial pressure of approximately 1 mTorr.

10. The method of claim 7 in which the focused ion beam comprises a beam of gallium ions focused to a sub-micron target point.

11. The method of claim 7 in which the substrate comprises a semiconductor.

12. The method of claim 11 in which the substrate comprises silicon.

13. The method of claim 7 in which exposing the photoresist material to a supply of water vapor includes exposing the photoresist material through a gas injection needle.

* * * * *